(12) United States Patent
Skrovan et al.

(10) Patent No.: US 6,277,746 B1
(45) Date of Patent: Aug. 21, 2001

(54) METHODS OF REDUCING CORROSION OF MATERIALS, METHODS OF PROTECTING ALUMINUM WITHIN ALUMINUM-COMPRISING LAYERS FROM ELECTROCHEMICAL DEGRADATION DURING SEMICONDUCTOR PROCESSING, AND SEMICODUCTOR PROCESSING METHODS OF FORMING ALUMINUM-COMPRISING LINES

(75) Inventors: John Skrovan, Boise; Allen McTeer, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/632,234

(22) Filed: Aug. 4, 2000

Related U.S. Application Data

(63) Continuation of application No. 09/066,613, filed on Apr. 24, 1998, now Pat. No. 6,110,830.

(51) Int. Cl.[7] .......................... H01L 21/44; H01L 21/302
(52) U.S. Cl. .......................... 438/687; 438/688; 438/692; 438/693
(58) Field of Search .................. 438/687, 688, 438/692, 693, 906

(56) References Cited

U.S. PATENT DOCUMENTS

| | | | |
|---|---|---|---|
| 5,336,371 | * 8/1994 | Chung et al. .................. 156/659.1 |
| 5,453,401 | * 9/1995 | Grivna et al. .................... 437/194 |
| 5,783,489 | * 7/1998 | Kaufman et al. ................ 438/692 |
| 5,820,746 | * 10/1998 | Kawaguchi et al. ............ 205/791 |
| 5,885,134 | * 3/1999 | Shibata et al. .................... 451/41 |
| 6,110,830 | * 8/2000 | Skrovan et al. ................. 438/688 |

OTHER PUBLICATIONS

Kaanta, Carter W., et al., "Dual Damascene: A ULSI Wiring Technology," Jun. 11–21, 1991, pp. 144–152, TH–0359–0/91/0000–0144.

* cited by examiner

Primary Examiner—John F. Niebling
Assistant Examiner—Alexander G. Gayka
(74) Attorney, Agent, or Firm—Wells, St. John, Roberts, Gregory, & Matkin, P.S.

(57) ABSTRACT

In one aspect, the invention includes a semiconductor processing method of reducing corrosion of a material, comprising exposing the material to a liquid solution comprising at least about 5% (by atomic percent) of an oxygen-comprising oxidant to form an oxide layer over the material. In another aspect, the invention includes a semiconductor processing method of forming an aluminum-comprising line within a layer of material, comprising: a) forming a layer of material over a semiconductive substrate; b) forming trenches within the layer of material; c) forming an aluminum-comprising layer within the trenches and over the layer of material; d) planarizing the aluminum-comprising layer to form aluminum-comprising lines within the material, the planarizing comprising abrading a portion of the aluminum-comprising layer with a first fluid, the first fluid comprising a slurry; and e) displacing the slurry with a second fluid comprising at least about 5% (by atomic percent) of ozone.

35 Claims, 2 Drawing Sheets

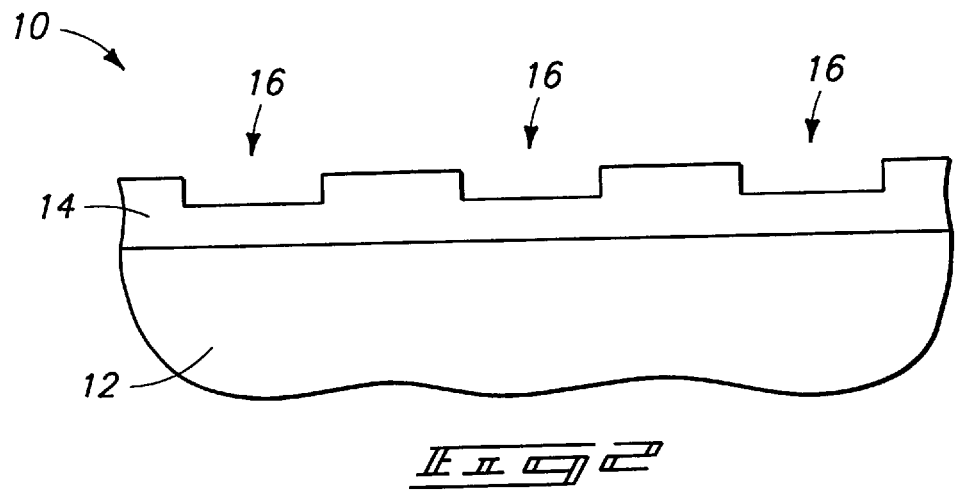
_Fig. 2_
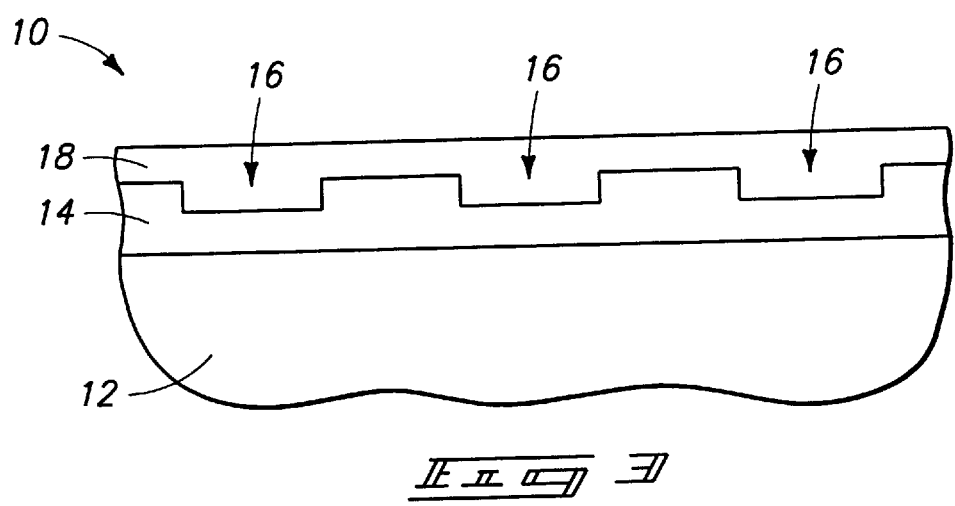
_Fig. 3_
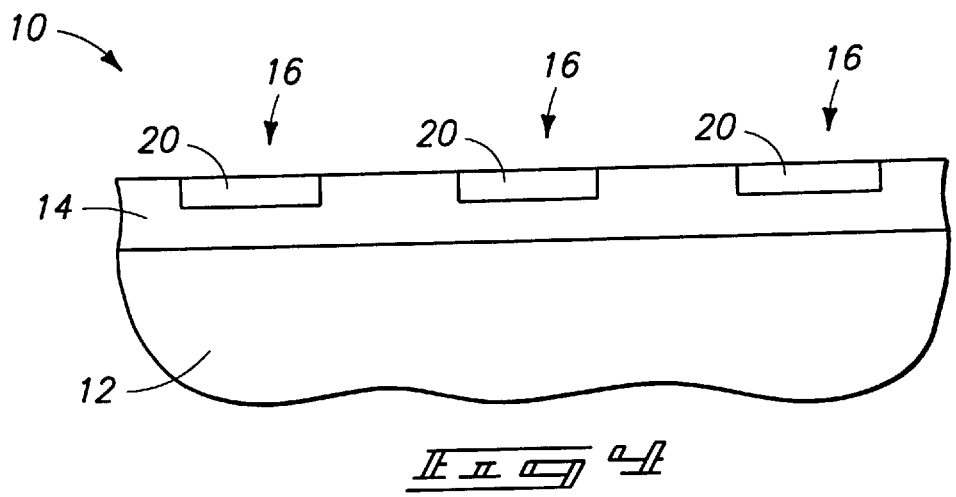
_Fig. 4_

METHODS OF REDUCING CORROSION OF MATERIALS, METHODS OF PROTECTING ALUMINUM WITHIN ALUMINUM-COMPRISING LAYERS FROM ELECTROCHEMICAL DEGRADATION DURING SEMICONDUCTOR PROCESSING, AND SEMICODUCTOR PROCESSING METHODS OF FORMING ALUMINUM-COMPRISING LINES

RELATED PATENT DATA

This patent resulted from a continuation application of U.S. patent application Ser. No. 09/066,613, now U.S. Pat. No. 6,110,830 filed on Apr. 24, 1998.

TECHNICAL FIELD

The invention pertains to semiconductor processing methods of reducing corrosion of materials. The invention has particular application to methods of forming aluminum-comprising lines, and to aluminum-comprising lines.

BACKGROUND OF THE INVENTION

Corrodible materials are frequently utilized in integrated circuitry formed on semiconductive wafers. In the context of this disclosure, the term "corrodible material" refers to a material that can undergo electrochemical degradation during semiconductor fabrication processes. An example corrodible material is an aluminum-comprising material. Aluminum-comprising materials can, for example, consist essentially of elemental aluminum, or can comprise an alloy, such as aluminum/copper. Aluminum-comprising materials are utilized in semiconductor applications as, for example, circuit components or conductive interconnects for electrically connecting circuit components.

A method of forming aluminum-comprising conductive interconnects is a damascene method. In a damascene method, a pattern of trenches is formed within an insulative material. An aluminum-comprising layer is then formed over the insulating material and within the trenches. The aluminum-comprising material is subsequently planarized to remove portions of the material that are not within trenches.

The planarization typically comprises chemical-mechanical polishing utilizing a polishing pad to rub an abrasive slurry against the aluminum-comprising layer. Typically, the slurry comprises an aluminum oxide grit within an aqueous carrier solution. The slurry can have a pH of, for example, from about 2.5 to about 4.0. Example slurries are EP-A5655 (sold by Cabot), and XVS-6902 (sold by Rodel). In alternative processes, a polishing pad is rubbed directly on an aluminum-comprising layer to abrade the layer. In such alternative processes, a liquid is typically provided over the aluminum-comprising layer during the abrading, but the liquid may not comprise a slurry. A prior art slurry polishing process is described with reference to FIG. 1.

In step "A" of the FIG. 1 process a surface of a wafer is polished with a slurry. In the example process described herein, the polishing is utilized to abrade an aluminum-comprising material. Polishing of an aluminum-comprising material can, for example, be incorporated into a damascene process.

After polishing of the aluminum-comprising layer, the slurry is displaced with deionized (DI) water (step "B" of the FIG. 1 process). The DI water is flushed between the polishing pad and the layer, with the polishing pad typically continuing to spin relative to the surface during such flushing. However, the DI water does not comprise a grit, so abrasion of the aluminum-comprising layer is substantially reduced as the DI water displaces the slurry. The DI water can comprise a small amount (10 to 20 ppm, or less than 0.01% (by atomic percent)) of ozone due to atmospheric ozone diffusing into the water. The DI water can also comprise a small amount (less than 0.1%) of carbon dioxide and/or carbonic acid due to diffusion of atmospheric carbon dioxide into the water.

After the slurry is displaced, the polishing pad is separated from the wafer, and the wafer is transferred to an unload bath (step "C" of the FIG. 1 process). The unload bath contains deionized water, and keeps a surface of the wafer wet as remaining wafers in a cassette are polished. Typically, a cassette will contain at least twenty-five wafers, and the wafers are polished one or two at a time. Polished wafers are kept wet as other wafers in a cassette are polished because otherwise grit remaining on the wafers from the polishing process can dry and become difficult to remove. The DI water in the unload bath has a pH of at least 7. As the wafers are transferred to the unload bath, they are preferably sprayed with water to alleviate drying of slurry granules on the wafers during the transfer.

After the wafers of a cassette are transferred to an unload bath, the wafers are transferred to a scrubber to further clean polishing grit from the wafer surfaces (step "D" of the FIG. 1 process). The scrubber comprises a load station were the wafers are kept prior to being scrubbed. The wafers are preferably sprayed with DI water as they are kept in the load station to alleviate grit drying on the wafers. The wafers are then scrubbed to remove residual grit on the wafer surfaces. The scrubbing can comprise mechanically brushing grit from a wafer surface while immersing the wafer surface in a liquid. The liquid can comprise, for example, water buffered with citric acid and tetramethylammonium hydroxide (TMAH) to maintain a pH of liquid within the scrubber to below 7. Such low pH liquid can assist in removing grit particles from the wafer.

After the grit on the wafer is removed with the scrubber, the wafer is transferred to a location where it is spun dry (step "E" of the FIG. 1 process).

A difficulty which can occur during the processing sequence described with reference to FIG. 1 is corrosion of a polished aluminum-comprising material. The corrosion can result in a loss of some or all of the aluminum-comprising material that is intended to remain on the wafer after the polishing process. If a relatively small amount of the material is lost, pits can occur within the aluminum-comprising material. If a larger amount of the material is lost, large crevices can be formed within the material.

Corrosion of an aluminum-comprising material can adversely affect physical properties of conductive lines formed from the aluminum-comprising material. For instance, conductance and strength of the aluminum-comprising material can be adversely affected. Also, pitting or crevice formation can decrease a surface planarity of a polished aluminum-comprising layer. As high surface planarity is frequently desirable for subsequent process steps, a decrease in surface planarity can adversely affect downstream fabrication processes utilizing the corroded aluminum-comprising layer. It would be desirable to develop alternative methods of processing aluminum-comprising layers wherein the above-described corrosion is avoided or at least reduced. More generally, it would be desirable to develop semiconductor processing methods which alleviate corrosion of processed materials.

SUMMARY OF THE INVENTION

In one aspect, the invention encompasses a semiconductor processing method of reducing corrosion of a material. The material is exposed to a liquid solution comprising at least about 5% (by atomic percent) of an oxygen-comprising oxidant to form an oxide layer over is the material.

In another aspect, the invention encompasses a semiconductor processing method of reducing a thickness of an aluminum-comprising layer. A portion of an aluminum-comprising layer is abraded with a first fluid comprising a slurry having a polishing grit. The first fluid is displaced with a second fluid comprising at least about 5% (by atomic percent) of an oxygen-comprising oxidant.

In yet another aspect, the invention encompasses a semiconductor processing method of forming an aluminum-comprising line within a layer of material. A layer of material is formed over a semiconductive substrate. Trenches are formed within the layer of material. An aluminum-comprising layer is formed within the trenches and over the layer of material. The aluminum-comprising layer is planarized to form aluminum-comprising lines within the material. The planarizing comprises abrading a portion of the aluminum-comprising layer with a first fluid comprising a slurry. The slurry is displaced with a second fluid comprising at least about 5% (by atomic percent) of ozone.

BRIEF DESCRIPTION OF THE DRAWINGS

Preferred embodiments of the invention are described below with reference to the following accompanying drawings.

FIG. 2 is a diagrammatic, fragmentary, cross-sectional view of a semiconductor wafer fragment at a preliminary step of a method of the present invention.

FIG. 3 is a view of the FIG. 2 wafer fragment shown at a processing step subsequent to that of FIG. 2.

FIG. 4 is a view of the FIG. 1 wafer fragment shown at a processing step subsequent to that of FIG. 3.

DETAILED DESCRIPTION OF THE PREFERRED EMBODIMENTS

Figure 1:
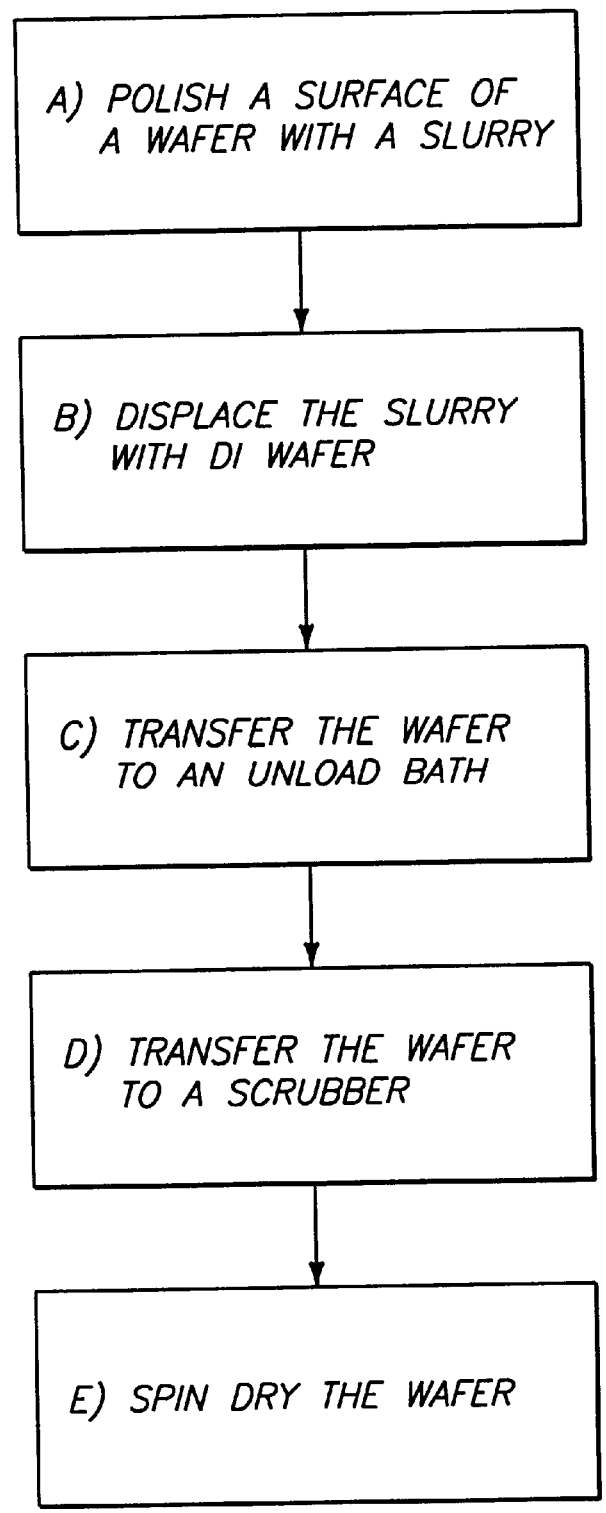
FIG. 1 is a flow chart view of a prior art semiconductor wafer fabrication process.

This disclosure of the invention is submitted in furtherance of the constitutional purposes of the U.S. Patent Laws "to promote the progress of science and useful arts" (Article 1, Section 8).

An exemplary method of the present invention is described with reference to FIGS. 2–4. Referring to FIG. 2, a semiconductive wafer fragment 10 comprises a substrate 12 and a dielectric (i.e. electrically insulative) material 14 overlying substrate 12. Substrate 12 can comprise, for example, a monocrystalline silicon wafer lightly doped with a p-type conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Dielectric material 14 can comprise, for example, silicon dioxide or borophosphosilicate glass (BPSG). Trenches 16 are formed within dielectric material 14. Trenches 16 define a pattern for formation of one or more aluminum-comprising lines.

Referring to FIG. 3, an aluminum-comprising layer 18 is provided over dielectric material 14 and within openings 16. The aluminum within aluminum-comprising layer 18 can be in the form of, for example, elemental aluminum or an aluminum/copper alloy. If aluminum-comprising layer 18 comprises an aluminum/copper alloy, the copper can be present, for example, in a concentration of from about 0.25 to about 2.5 weight percent.

Referring to FIG. 4, aluminum-comprising layer 18 is planarized to remove portions of layer 18 from over substrate 14 while leaving other portions of layer 18 remaining within openings 16. The portions of aluminum-comprising layer 18 remaining within openings 16 comprise one or more conductive lines 20. The planarization of aluminum-comprising layer 18 (FIG. 2) can comprise chemical-mechanical polishing utilizing a first fluid that comprises a slurry, or utilizing an abrasive polishing pad without a slurry. If the first fluid comprises a slurry, it can comprise, for example, a slurry of the type discussed above in the "Background" section of this disclosure.

After layer 18 is planarized, a slurry can be displaced from over insulative material 14 with a second fluid. The second fluid is preferably a liquid, and preferably does not comprise grit. Most preferably, the second fluid is a liquid solution comprising at least 5% (by atomic percent) of an oxygen-comprising oxidant. For purposes of interpreting this disclosure and the claims that follow, the term "fluid" encompasses liquids and slurries, and the term "liquid" can refer to a liquid portion of a slurry unless specified otherwise. The preferred fluid for displacing a slurry is a liquid which is not within a slurry.

The oxygen-comprising oxidant can comprise, for example, $O_3$ (ozone), or $H_2O_2$ (hydrogen peroxide). Preferably, the oxygen-comprising oxidant comprises ozone, and more preferably, the oxygen-comprising oxidant consists essentially of ozone. The oxygen-comprising oxidant can be present in the second fluid to, for example, a concentration of at least about 10% (by atomic percent), a concentration of at least about 50% (by atomic percent), or a concentration of from about 10% (by atomic percent) to about 50% (by atomic percent).

The oxygen-comprising oxidant oxidizes an upper surface of planarized aluminum layer 18 to form a protective layer of aluminum oxide over the aluminum within layer 18. Such protective layer can alleviate corrosion of aluminum underlying the protective layer to avoid loss of aluminum from within layer 18. Thus, the aluminum oxide over layer 18 can alleviate corrosion of aluminum within layer 18, and can thereby alleviate corrosion-induced defects such as, for example, pit or crevice formation.

The fluid utilized to displace the polishing slurry (i.e., the second fluid) can have a pH of at least 7, or less than 7. In some embodiments, it is preferred for the fluid to have a pH of less than 7, as such acidic pH can reduce corrosion of an aluminum-comprising layer relative to the corrosion which occurs when higher pH fluids are utilized. Specifically, it is found that electrochemical degradation can be a mechanism whereby aluminum-comprising layers are corroded, and that a rate of electrochemical degradation can be decreased by utilizing a liquid having a pH of less than 7. It is observed that corrosion of polished aluminum-comprising layers rinsed with prior art water-comprising liquids generally occurs after a polishing slurry is removed from the layer, rather than while the polishing slurry is in contact with the layer. Such observation is consistent with a mechanism whereby the corrosion is caused by electrochemical degradation enhanced by a water-comprising liquid provided to displace slurry from the aluminum-comprising layer. It is also observed that if a water-comprising liquid having a pH of less than 7 is utilized to remove polishing slurry from an aluminum-comprising layer, corrosion of the layer can be reduced relative to prior art methods of removing slurry from aluminum-comprising layers with solutions having pH's of at least 7.0. This observation is also consistent with a mechanism wherein corrosion of aluminum-comprising layers is due to electrochemical degradation enhanced by basic solutions. Although a mechanism of electrochemical degradation induced corrosion is presented herein, it is to be understood that the present invention is intended to be limited only by the claims that follow, and not by any particular mechanism.

Methods for decreasing the pH of a solution can include, for example, incorporating one or more acids within the solution. Unless specified otherwise, the term "acid" is utilized herein to refer to both protonated and unprotonated forms of acidic material. The acid can either be a strong acid (i.e., an acid having a $pk_a$ of less than 2) or a weak acid (i.e., an acid having a $pk_a$ of greater than or equal to 2).

An example acid for utilization in the present invention is citric acid. If citric acid is utilized in a method of the present invention, it is preferably utilized in combination with a base (such as, for example, tetramethylammonium hydroxide (TMAH)) to form a buffered solution having a pH of from about 2 to about 6.5, more preferably from about 4.5 to about 6.5, and yet more preferably of from about 5 to about 5.5. As citric acid has one $pk_a$ at about 4.8 and another at about 6.4, it can form a good buffer in the preferred range of from about 2 to about 6.5. TMAH is a preferred base because TMAH is known in the art to be particularly effective for removal of aluminum oxide grit. An example water-comprising liquid of the present invention can be formed by mixing 190 ml. of 10% (by atomic percent) citric acid, with 60 ml. of 25% (by atomic percent) TMAH and 5 gallons of water. Preferably, the ratio of 10% citric acid to 25% TMAH is at least 3:1 (forming a ratio of citric acid to TMAH within the water-comprising liquid of greater than about 1.25) to ensure that a pH of the liquid is below about 6.5.

Another example acid for utilization in the present invention is carbonic acid. Carbonic acid has a $pk_a$ of about 6.4, and therefore can be an effective buffer within the preferred pH range of from about 2.0 to about 6.5. Also, carbonic acid can be relatively easily added to a water-comprising liquid, by, for example, bubbling gaseous carbon dioxide through the water-comprising liquid. The carbonic acid solution preferably comprises at least 10% (by atomic percent) of carbon dioxide derivatives (i.e. $CO_2$, $H_2CO_3$, and $HCO_3$—), more preferably comprises 40% (by atomic percent) of $CO_2$ derivatives, and most preferably comprises 50% (by atomic percent) of $CO_2$ derivatives.

In accordance with the present invention, the fluids described with reference to steps "B"–"D" of the prior art processing sequence of FIG. 1 are preferably replaced with solutions comprising an oxygen-comprising oxidant and/or a pH of less than 7. Specifically, the unload bath described with reference to step "C" of FIG. 1 preferably comprises a liquid having a pH of less than 7. Preferred liquids are liquids comprising either citric acid, or a mixture of citric acid and TMAH. If a liquid utilized in the unload bath comprise citric acid without TMAH, it preferably comprises a pH of from about 3 to about 3.5. If the liquid comprises a mixture of TMAH and citric acid, it preferably comprises a pH of from about 5 to about 5.5. The bath can also comprise at least 10% (by atomic percent) of ozone, at least 50% (by atomic percent) of ozone, or from about 10% (by atomic percent) to about 50% (by atomic percent) of ozone.

Also in accordance with the present invention, the scrubber described with reference to Step "D" of FIG. 1 preferably comprises a liquid comprising a pH of less than 7. Preferred liquids are the citric acid, or citric acid/TMAH comprising liquids described above as preferred liquids for the unload bath of step "C" of FIG. 1. Further, the solutions utilized to wet a wafer surface during transfer of a wafer between a polishing apparatus and an unload bath (for instance, the transfer between steps "B" and "C" of the process shown in FIG. 1), and in the load station of a scrubber preferably comprise water solutions having pHs of less than 7. A preferred water solution is a solution comprising carbon dioxide derivatives and water, and is not a slurry. Such solution preferably comprises at least 10% (by atomic percent) of carbon dioxide derivatives. Other example solutions comprise at least about 40% (by atomic percent) of carbon dioxide derivatives, and at least 50% (by atomic percent) of carbon dioxide derivatives. Another preferred solution is a solution comprising ozone and water.

In a most preferred process, an unload bath (such as that described with reference to step "C" of the FIG. 1 process) comprises citric acid/TMAH and a pH of less than 7, a scrubber (such as that described with reference to step "D" of the FIG. 1 process) comprises citric acid/TMAH and a pH of less than 7, and a rinse water (such as that described as utilized between steps "B" and "C" of the FIG. 1 process comprises a solution consisting essentially of water and ozone, with the ozone being present to a concentration of at least about 5% (by atomic percent). Also in a most preferred process, a rinse water described as utilized in the load station of the step "D" scrubber of the FIG. 1 process comprises a solution consisting essentially of water and carbon dioxide derivatives, with the derivatives being present to a concentration of at least about 10% (by atomic percent).

It is to be understood that, although the invention is described above with reference to application to aluminum-comprising materials, the invention extends to other materials. The invention can, for example, be utilized for alleviating corrosion of any materials which are subject to electrochemical degradation, and which can be protected from such degradation forming a thin oxide layer at a surface of the material, or by reducing a pH of a fluid to which the material is exposed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of reducing corrosion of a material, comprising exposing the material to a liquid solution comprising at least about 5% (by atomic percent) of an oxygen-comprising oxidant for a time effective to form a corrosion reducing oxide layer over the material, the liquid solution not being comprised by a slurry and the oxygen-comprising oxidant comprising at least one of $O_3$ and carbon dioxide derivatives.

2. The method of claim 1 wherein the liquid solution consists of water and the oxygen-comprising oxidant.

3. The method of claim 1 wherein the liquid solution comprises at least about 10% (by atomic percent) of the oxygen-comprising oxidant.

4. The method of claim 1 wherein the liquid solution comprises from about 10% (by atomic percent) to about 50% (by atomic percent) of the oxygen-comprising oxidant.

5. The method of claim 1 wherein the liquid solution comprises at least about 50% (by atomic percent) of the oxygen-comprising oxidant.

6. The method of claim 1 wherein the oxygen-comprising oxidant comprises $O_3$.

7. The method of claim 1 wherein the oxygen-comprising oxidant consists essentially of $O_3$.

8. A semiconductor processing method of reducing corrosion of an aluminum-comprising material, comprising exposing the aluminum-comprising material to a fluid comprising at least about 5% (by atomic percent) of an oxygen-comprising oxidant for a time effective to form a corrosion reducing aluminum oxide layer over the aluminum-comprising material, the fluid not being comprised by a slurry and the oxygen-comprising oxidant comprising at least one of $O_3$ and carbon dioxide derivatives.

9. The method of claim 8 wherein the fluid consists of water and the oxygen-comprising oxidant.

10. The method of claim 8 wherein the oxygen-comprising oxidant comprises $O_3$.

11. The method of claim 8 wherein the oxygen-comprising oxidant consists essentially of $O_3$.

12. The method of claim 8 wherein the fluid comprises a pH of less than 7.0.

13. The method of claim 8 wherein the fluid comprises a pH of at least 7.0.

14. The method of claim 8 wherein the aluminum-comprising material comprises elemental aluminum.

15. The method of claim 8 wherein the aluminum-comprising material comprises an aluminum/copper alloy.

16. A semiconductor processing method of reducing corrosion of a material, comprising exposing the material to a fluid comprising at least about 10% (by atomic percent) of carbon dioxide derivatives, the atomic percent being effective to reduce corrosion of the material compared to a fluid comprising less than 0.1% (by atomic percent) of carbon dioxide derivatives and the fluids not being comprised by a slurry.

17. The method of claim 16 wherein the fluid consists of water and the carbon dioxide derivatives.

18. The method of claim 16 wherein the fluid comprises at least about 40% (by atomic percent) of the carbon dioxide derivatives.

19. The method of claim 16 wherein the fluid comprises at least about 50% (by atomic percent) of the carbon dioxide derivatives.

20. A semiconductor processing method of reducing a thickness of an aluminum-comprising layer, comprising:
    abrading a portion of an aluminum-comprising layer with a first fluid, the first fluid comprising a slurry having a polishing grit; and
    displacing the first fluid with a second fluid comprising at least about 5% (by atomic percent) of an oxygen-comprising oxidant and contacting the portion with the second fluid for a time effective to form a corrosion reducing aluminum oxide layer on the portion, the second fluid not being comprised by a slurry.

21. The method of claim 20 wherein the second fluid consists of water and the oxygen-comprising oxidant.

22. The method of claim 20 wherein the oxygen-comprising oxidant comprises $O_3$.

23. The method of claim 20 wherein the oxygen-comprising oxidant consists essentially of $O_3$.

24. The method of claim 20 wherein a difference between the first and second fluids is that the second fluid does not comprise a polishing grit.

25. The method of claim 20 wherein the first and second fluids comprise water.

26. The method of claim 20 wherein the second fluid comprises water.

27. The method of claim 20 wherein the second fluid comprises water and does not comprise a polishing grit.

28. A semiconductor processing method of forming an aluminum-comprising line within a layer of material, comprising:
    forming a layer of material over a semiconductive substrate;
    forming trenches within the layer of material;
    forming an aluminum-comprising layer within the trenches and over the layer of material;
    planarizing the aluminum-comprising layer to form aluminum-comprising lines within the material, the planarizing comprising abrading a portion of the aluminum-comprising layer with a first fluid, the first fluid comprising a slurry; and
    displacing the slurry with a second fluid comprising at least about 5% (by atomic percent) of ozone and contacting the aluminum-comprising lines with the second fluid for a time effective to form a corrosion reducing aluminum oxide layer on the portion, the second fluid not being comprised by a slurry.

29. The method of claim 28 wherein the second fluid comprises at least about 10% (by atomic percent) of the ozone.

30. The method of claim 28 wherein the second fluid comprises from about 10% (by atomic percent) to about 50% (by atomic percent) of the ozone.

31. The method of claim 28 wherein the second fluid comprises at least about 50% (by atomic percent) of the ozone.

32. The method of claim 28 further comprising, after displacing the slurry, rinsing the substrate with a third fluid comprising at least about 10% (by atomic percent) of carbon dioxide derivatives.

33. The method of claim 28 wherein the second fluid consists of water and the ozone.

34. The method of claim 28 wherein the material comprises an insulative material.

35. The method of claim 28 wherein the planarizing comprises chemical-mechanical polishing.

* * * * *

UNITED STATES PATENT AND TRADEMARK OFFICE
CERTIFICATE OF CORRECTION

PATENT NO. : 6,277,746 B1
DATED : August 21, 2001
INVENTOR(S) : John Skrovan et al.

It is certified that error appears in the above-identified patent and that said Letters Patent is hereby corrected as shown below:

<u>Column 3,</u>
Line 6, replace "over is the material." with -- over the material. --

Signed and Sealed this

Sixteenth Day of April, 2002

Attest:

JAMES E. ROGAN
*Attesting Officer*     *Director of the United States Patent and Trademark Office*